United States Patent [19]
Lin

[11] Patent Number: 6,107,681
[45] Date of Patent: *Aug. 22, 2000

[54] PIN-ASSIGNMENT METHOD FOR INTEGRATED CIRCUIT PACKAGES TO INCREASE THE ELECTRO-STATIC DISCHARGE PROTECTIVE CAPABILITY THEREOF

[75] Inventor: Shi-Tron Lin, Taipei, Taiwan

[73] Assignee: Winbond Electronics Corp., Hsin-Chu, Taiwan

[ * ] Notice: This patent is subject to a terminal disclaimer.

[21] Appl. No.: 09/045,327

[22] Filed: Mar. 20, 1998

[30] Foreign Application Priority Data

Oct. 22, 1997 [TW] Taiwan ................................ 86115577

[51] Int. Cl.$^7$ ...................................................... H01L 23/48

[52] U.S. Cl. ............................................ 257/693; 438/106

[58] Field of Search ..................................... 257/355, 693

[56] References Cited

U.S. PATENT DOCUMENTS

| | | | |
|---|---|---|---|
| 4,990,996 | 2/1991 | Kumar et al. | 257/786 |
| 5,512,783 | 4/1996 | Wakefield et al. | 257/693 |
| 5,869,870 | 2/1999 | Lin | 257/355 |

*Primary Examiner*—Wael Fahmy
*Assistant Examiner*—William David Coleman
*Attorney, Agent, or Firm*—Thomas, Kayden, Horstemeyer & Risley

[57] ABSTRACT

A pin-assignment method is provided for use on an IC package to arrange pin connections. The pin-assignment method can allow an improvement in the electro-static discharge (ESD) protection capability for the IC chip packed in the IC package. Specifically, the pin-assignment method organizes the no-connect pins of the IC package into groups and then assigns each of the two pins that bound each no-connect pin group to be connected to a power bus of the IC chip. This allows for an increased ESD protective capability for the no-connect pins. Moreover, the pin-assignment method can simplify the wiring complexity of the IC package.

35 Claims, 5 Drawing Sheets

PIN-ASSIGNMENT METHOD FOR INTEGRATED CIRCUIT PACKAGES TO INCREASE THE ELECTRO-STATIC DISCHARGE PROTECTIVE CAPABILITY THEREOF

CROSS-REFERENCE TO RELATED APPLICATION

This application claims the priority benefit of Taiwan application serial no. 86115577, filed Oct., 22, 1997, the full disclosure of which is incorporated herein by reference.

BACKGROUND OF THE INVENTION

1. Field of the Invention:

This invention relates in general to a pin-assignment method for integrated circuit (IC) packages, which can allow an increase in the electro-static discharge (ESD) protective capability for the IC chip packed in the IC package. Specifically, the pin-assignment method arranges the no-connect pins of the IC package into groups and then assigns each of the two pins that bound each no-connect pin group to be connected to a power line, whereby the IC chip can be increased in its ESD protective capability and simplified in its wiring complexity.

2. Description of Related Art:

Electrostatic discharge (ESD) is a movement of static electricity from a nonconductive surface, which usually causes damage to the semiconductors and various other circuit components in IC chips. A person walking on a carpet, for instance, can carry an amount of electrostatic charge up to several thousands of volts under high relative humidity (RH) conditions and over 10,000 volts under low relative humidity conditions. If such a person touches an IC chip by hand, the electrostaticity on his/her body would instantaneously be discharged to the IC chip, thus causing damage to the IC chip. The ESD damage is particularly common and severe on CMOS (complementary metal-oxide semiconductor) IC devices.

To protect IC chips against ESD damage, various solutions have been proposed. One solution suggests the provision of an ESD protective circuit between the internal circuit of the IC chip and each of the bonding pads. FIG. 1 shows a conventional pinassignment method used on an IC package. As shown, the IC package includes an IC chip on which an internal circuit 20 and a plurality of bonding pads 11, 13, 15 are formed. Further, the IC package includes a plurality of pins 10, 12, 14, 16, 17, 18, 19 on the periphery thereof, of which the pin 10 is a power pin (i.e., $V_{DD}$ or $V_{SS}$ pin) which is internally connected via a bonding wire 100 to the bonding pad 11; the pin 12 is an I/O pin which is internally connected via a bonding wire 120 to the bonding pad 13; the pin 14 is an input pin which is internally connected via a bonding wire 140 to the bonding pad 15; and the other pins 16, 17, 18, 19 are not in use (not wired) and thus are referred to as "no-connect pins". To prevent ESD current from flowing via the bonding pads 11, 13, 15 into the internal circuit, each of the bonding pads 11, 13, 15 is connected to a ESD protective circuit (not shown).

A trend in IC packaging is to provide a larger number of pins on a single package so as to achieve the purpose of a high packing density of pins on the IC package. Since the IC package is very small in size, the increased number of pins will cause the gap (i.e., the pitch) between two adjacent pins, as indicated by the reference numeral G in FIG. 1 between the pins 14 and 19, to be further reduced. The reduction of the pin gap, however, causes a new problem in ESD protection for the IC package. This problem is described in a paper entitled "New Failure Mechanism due to No-Connect Pin ESD Stressing" which is authored by Matsumoto et al. and published in 1994 EOS/ESD Symposium, pp.90–95. This paper reveals the fact that, when a human body model (HBM) ESD pulse is repeatedly applied to a certain no-connect pin on the IC package, any of its two neighboring pins, if wired to the internal circuit, would become particularly vulnerable to ESD damage. This is because that the electrostatic charge will accumulate in the resin around the no-connect pin, thus resulting in a large potential difference between the no-connect pin and its neighboring pins, thus significantly reducing the ESD resistant capability of the neighboring pins.

Taking the IC package of FIG. 1 as an example, assume that the input pin 14 is able to withstand a maximum of ESD stress of 3 kV (kilovolt), then when an ESD stress of 1.5 kV is applied to the no-connect pin 19, the electrostatic charge therefrom will accumulate in the resin around the no-connect pin 19, eventually resulting in a large potential difference between the no-connect pin 19 and its neighboring pins (i.e., 14, 18). When this potential reaches a large enough level, it would cause a sudden ESD current to flow through the gap G to the neighboring pin 14. Said ESD current will then flow from the pin 14 via the bonding wire 140 and the bonding pad 15 to the internal circuit, whereby an ESD damage could occur. In short, when an ESD stress of 3 kV is being applied to the pin 14, the internal circuit of the IC chip wired to the pin 14 would not be damaged thereby; however, the application of an ESD stress of 1.5 kV to the no-connect pin 19 would cause ESD damage to the internal circuit wired to the neighboring pin 14.

Early types of IC packages have only a small number of pins thereon, so the above-mentioned proximity problem that would cause ESD damage is unobvious. However, newer types of IC packages, such as QFP (quad flat packages), MQFP, TQFP, etc., usually come with more than one hundred pins that are packed in plastic or resin compounds. With such a large number of pins on a small-size IC package, the abovementioned proximity problem becomes a serious consideration. One conventional solution to this problem is to increase the ESD protective capability of the input and I/O pins of the IC package to a higher level, for example from 2 kV to 4–5 kV. This scheme can protect the input and I/O pins of the IC package against ESD damage when any of its neighboring no-connect pins is subjected to an ESD stress of 2 kV. One drawback to this solution, however, is that the ESD protective circuitry needed to provide such an ESD protective capability will take up more area on the IC chip, thus increasing the chip size.

On an IC package, those pins that are electrically and functionally engaged, such as input pins, output pins, I/O pins, and power pins, are referred to as active pins. Each active pin is electrically wired to a bonding pad and an ESD protective circuit. Typically, the circuit connected to the power buses on the IC chip has the highest ESD protective capability since the power pins are connected to the power bus $V_{DD}$ or $V_{SS}$. In addition to its high ESD capacity, each power bus has a capacitance of from 1 nF (nanofarad) to 10 nF formed between the N-well and P-well, or between the N-well and the substrate of the IC chip, which can absorb a great amount of charges from ESD. The input pins, I/O pins and output pins are inferior to the power pins in ESD protective capability.

FIGS. 2A and 2B are schematic diagrams used to depict two conventional pinassignment methods used for pin assignment on IC packages.

Referring to FIG. 2A, the IC package shown here includes an IC chip 58 having a plurality of bonding pads 42, 44, 46, 48 formed thereon. Further, the IC package includes a plurality of pins 30, 32, 34, 36, 38, 40, which are respectively assigned as a $V_{SS}$ power pin, an input pin, a first no-connect pin, a $V_{DD}$ power pin, a second no-connect pin, and an I/O pin. The $V_{SS}$ power pin 30, the input pin 32, the $V_{DD}$ power pin 36, and the I/O pin 40 are wired respectively via a plurality of bonding wires 50, 52, 54, 56 to the bonding pads 42, 44, 46, 48; while the first and second no-connect pins 34, 38 are unwired. Via the bonding pads 42, 44, 46, 48, these active pins (i.e., 30, 32, 36, 40) are functionally connected to the internal circuit of the IC chip 58.

Referring to FIG. 2B, the IC package shown here includes an IC chip 88 having a plurality of bonding pads 72, 74, 76, 78 formed thereon. Further, the IC package includes a plurality of pins 60, 62, 64, 66, 68, 70, which are respectively assigned as a $V_{SS}$ power pin, an input pin, a first no-connect pin, a second no-connect pin, an I/O pin, and a $V_{DD}$ power pin. The $V_{SS}$ power pin 60, the input pin 62, the I/O pin 68, and the $V_{DD}$ power pin 70 are wired respectively via a plurality of bonding wires 80, 82, 84, 86 to the bonding pads 72, 74, 76, 78; while the first and second no-connect pins 64, 66 are unwired. Via the bonding pads 72, 74, 76, 78, these active pins (i.e., 60, 62, 68, 70) are functionally connected to the internal circuit of the IC chip 88.

It can be seen from FIGS. 2A and 2B that, by the conventional pin-assignment methods, the no-connect pins are arranged arbitrarily; in the case of FIG. 2A, for example, the no-connect pins are arranged next to the input pin, the $V_{DD}$ power pin, and the I/O pin; while in the case of FIG. 2B, the no-connect pins are arranged next to the input pin and the I/O pin. These pin-assignment methods take no consideration of ESD protections. Therefore, when these pin-assignment methods are utilized on IC packages with a high density of pins, the arrangement of the no-connect pins next to ESD-sensitive pins could cause the problem of ESD damage.

SUMMARY OF THE INVENTION

It is therefore an objective of the present invention to provide a pin-assignment method for an IC package, which can increase the ESD protective capability for the IC chip encased in the IC package and also simplify the complexity of the ESD protective circuitry needed to provide the ESD protective capability.

In accordance with the foregoing and other objectives of the present invention, a pin-assignment method capable of increasing the ESD protective capability of an IC chip is provided. The pin-assignment method arrange said no-connect pins into at least one group including either one no-connect pin or a number of consecutive no-connect pins, and then assigns each of the two pins that bound each no-connect pin group to be connected to a power bus. Fundamentally, the pins of an IC package are organized in such a manner that the no-connect pins are set apart into a plurality of groups, each group containing one no-connect pin or a number of consecutive no-connect pins, and each of the two pins that bound each no-connect pin group is assigned to a power line. This allows for an increased ESD protective capability for the no-connect pins.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, the pins of an IC package are arranged in such a manner that the no-connect pins are set apart into a plurality of groups or at least one group, with each group containing one single no-connect pin or a number of consecutive no-connect pins, and then each of the two pins that bound both sides of each no-connect pin group is assigned to be a power pin, such as a power pin $V_{DD}$, a power pin $V_{SS}$, or a ground pin GND, for electrically connect to a power bus $V_{DD}$, a power bus $V_{SS}$, or a ground bus GND of the IC chip. This arrangement is based on the fact that the pins that are connected to a power bus can better withstand the condition of its neighboring no-connect pin being subjected to an ESD stress of 5 kV. Therefore, in this case, the ESD protective circuitry for the power pins needs not be expanded while nonetheless retaining good ESD protective capability.

Figure 1:
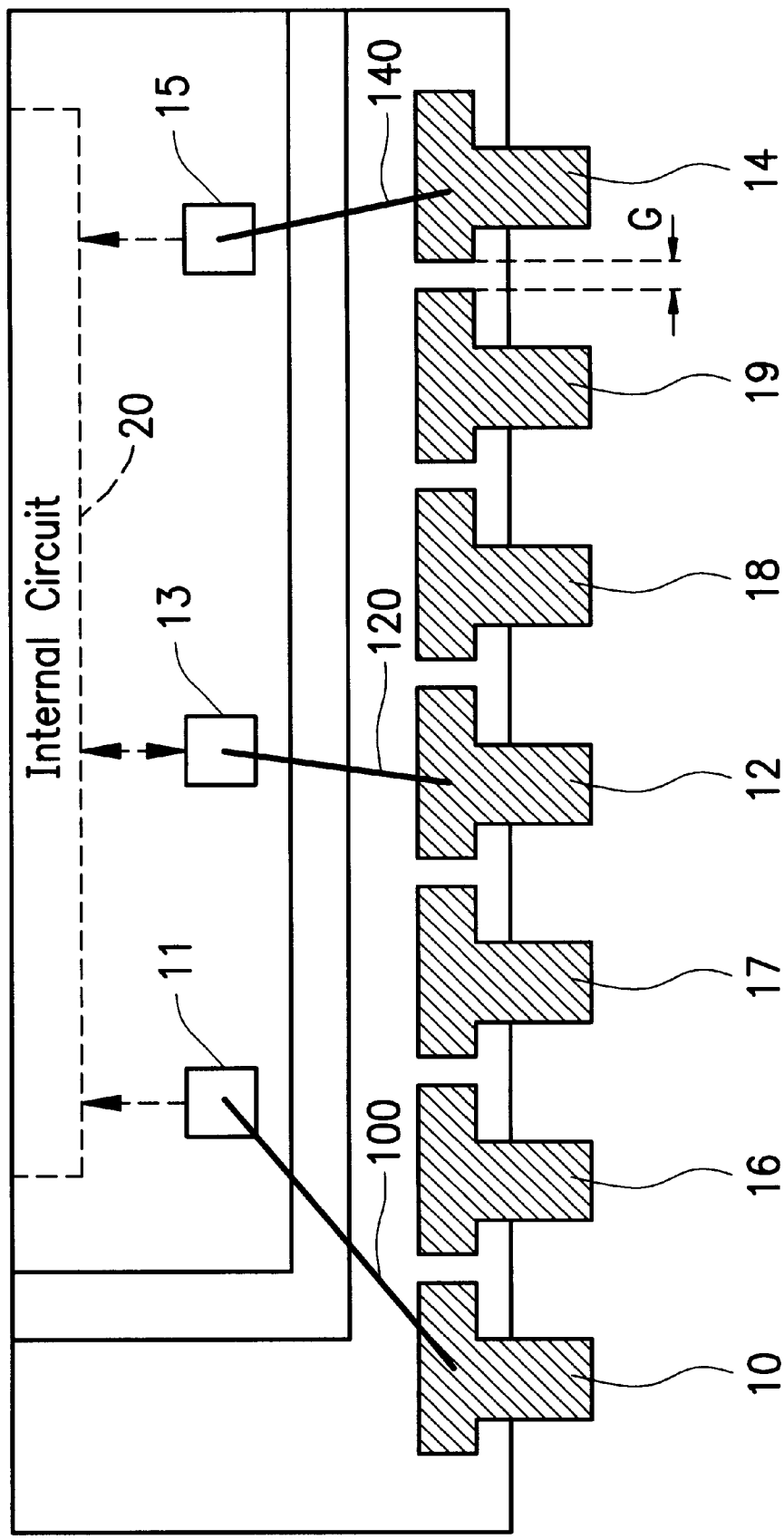
FIG. 1 is a schematic diagram used to depict the proximity problem which arises in an IC package having a high density of pins with a small pitch.
Figure 2A:
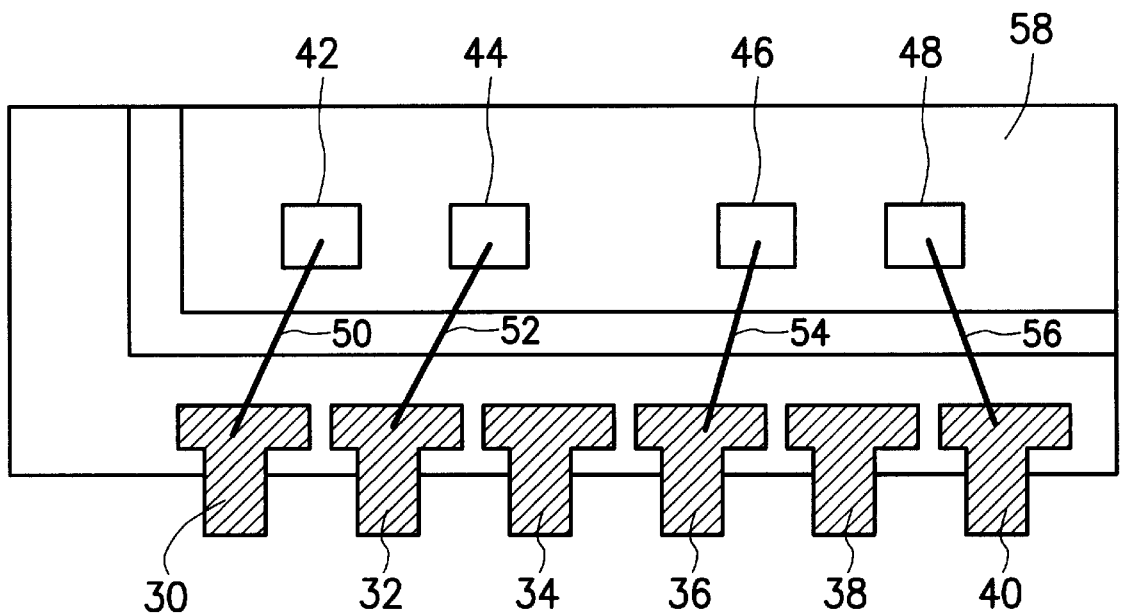
FIG. 2A is a schematic diagram used to depict a first conventional pin-assignment method for pin assignment on an IC package.
Figure 2B:
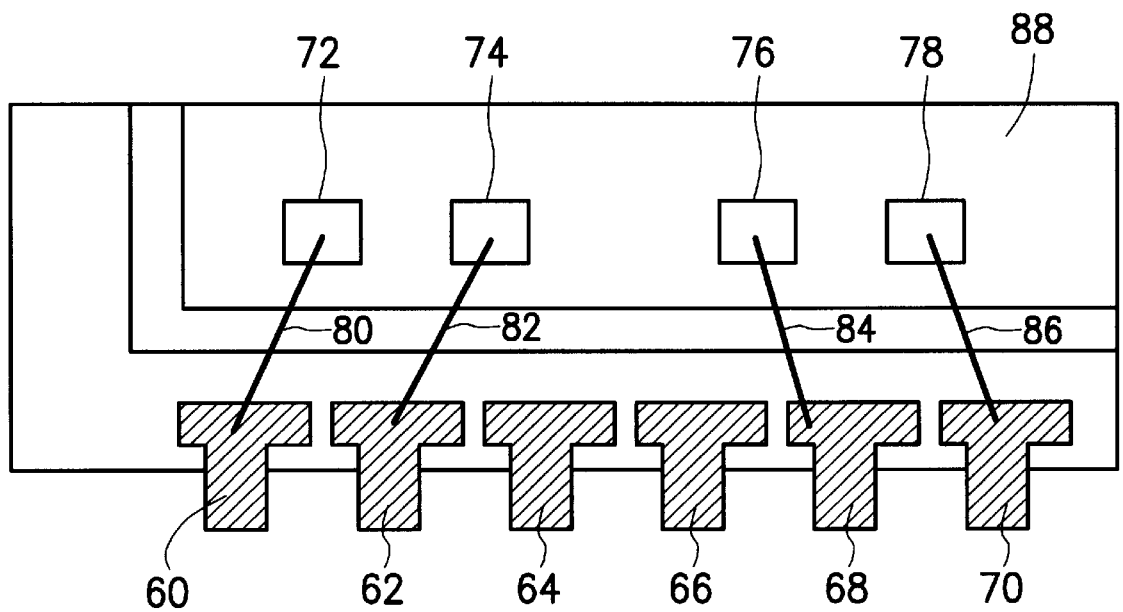
FIG. 2B is a schematic diagram used to depict a second conventional pinassignment method for pin assignment on an IC package.
Figure 3:
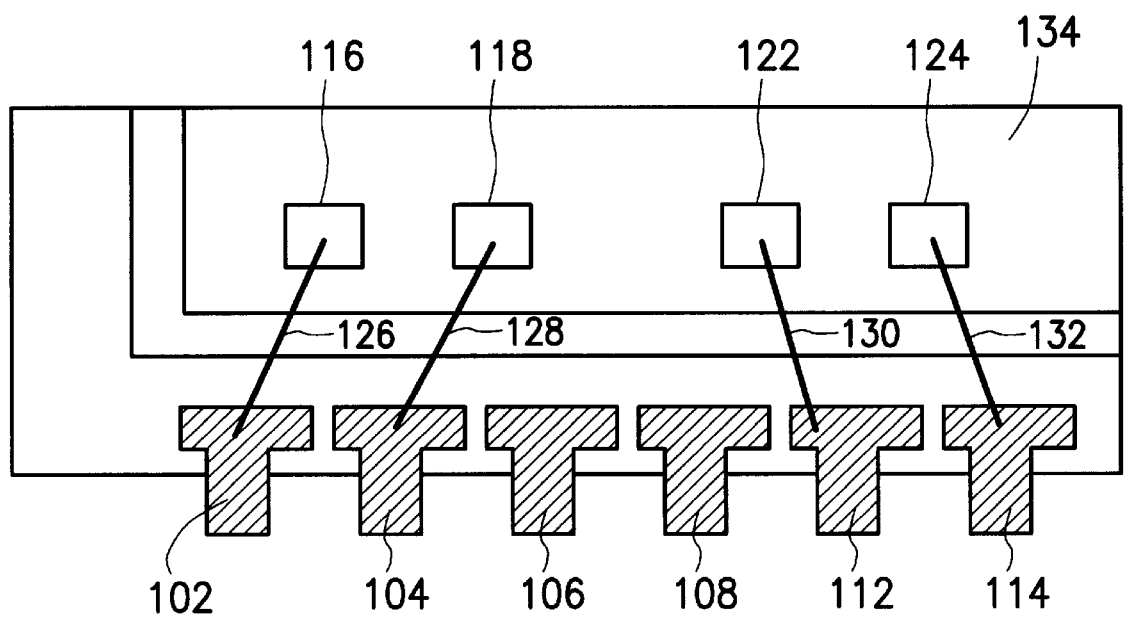
FIG. 3 is a schematic diagram used to depict a first preferred embodiment of the pin-assignment method according to the invention for pin assignment on an IC package.

FIG. 3 is a schematic diagram depicting the pin-assignment method according to the invention for pin assignment on an IC package. The IC package includes an IC chip 134 having a plurality of bonding pads 116, 118, 122, 124 formed thereon. Further, the IC package includes a plurality of pins 102, 104, 106, 108, 112, 114 which are assigned respectively as an input pin, a $V_{SS}$ power pin, a first no-connect pin, a second no-connect pin, a $V_{DD}$ power pin, and an I/O pin. The input pin 102 is internally wired via a bonding wire 126 to the bonding pad 116; the $V_{SS}$ power pin 104 is internally wired via a bonding wire 128 to the bonding pad 118; the $V_{DD}$ power pin 112 is internally wired via a bonding wire 130 to the bonding pad 122; the I/O pin 114 is internally wired via a bonding wire 132 to the bonding pad 124; and the no-connect pins 106, 108 are unwired. The two no-connect pins 106, 108 are consecutive in order on the IC package and therefore are considered as one group. In accordance with the invention, the two pins that bound both sides of this no-connect pin group, i.e., the pin 104 and the pin 112, are each assigned as a power line; for example, in the case of FIG. 3, the pin 104 is assigned as a $V_{SS}$ power pin, while the pin 112 is assigned as a $V_{DD}$ power pin. With this arrangement, the ESD stress applied to the two no-connect pins 106, 108 would substantially cause no ESD damage to other pins. The no-connect pins 106, 108 therefore need not be connected to additional ESD protective circuits.

Figure 4:
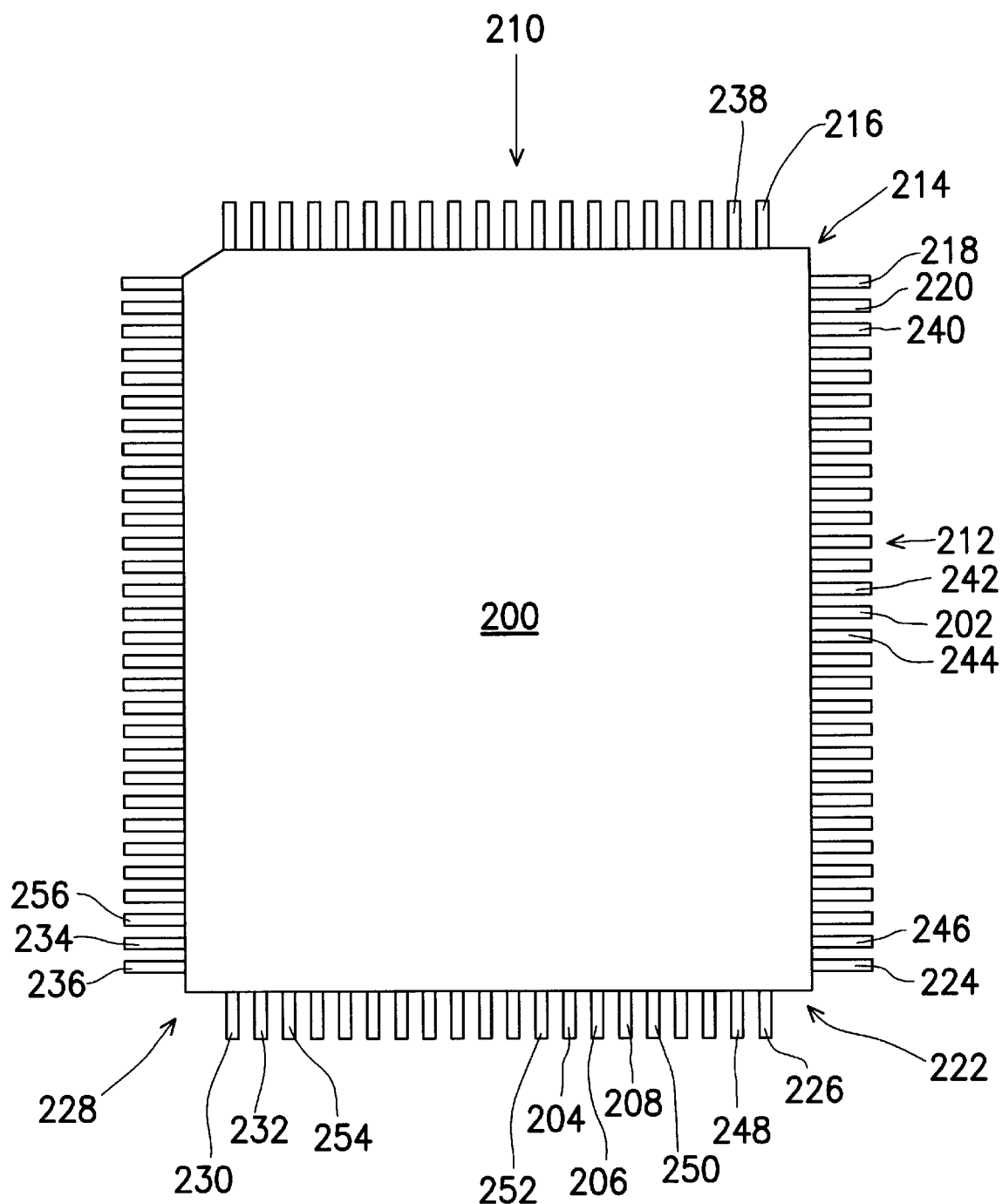
FIG. 4 is a schematic top view of an IC package used to depict the definition of a consecutive group of no-connect pins in accordance with the pin-assignment method of the invention.

FIG. 4 is a schematic top view of an IC package used to depict the definition of "no-connect pin group" in accordance with the pin-assignment method of the invention. The IC package 200 here is a quad flat package having four sides and four corners. A no-connect pin group is defined as a single no-connect pin or a number of consecutive no-connect pins. If two no-connect pins are arranged on the same corner but on different sides, for example the pin 216 and the pin 218, on the angle 214, the pin 224 and the pin 226 on the angle 222, and the pin 230 and the pin 236 on the corner 228, they are still considered as consecutive and thus belong to the same group.

In the case of FIG. 4, for example, assume the following no-connect pin groups are arranged: the pins 216, 218, 220; the pin 202; the pins 224, 226; the pins 204, 206, 208; and the pins 234, 236, 230, 232. In accordance with the invention, each no-connect pin group should be bounded by two power pins. Therefore, the two pins 238, 240 which bound the consecutive group of no-connect pins 216, 218, 220 are each assigned as a power pin; the two pins 242, 244 which bound the single no-connect pin 202 are each assigned as a power pin; the two pins 246, 248 which bound the consecutive group of no-connect pins 224, 226 are each assigned as a power pin; the two pins 250, 252 which bound the consecutive group of no-connect pins 204, 206, 208 are each assigned as a power pin; and the two pins 254, 256 which bound the consecutive group of no-connect pins 234, 236, 230, 232 are each assigned as a power pin. The power pins can be electrically connected to the power bus $V_{DD}$, the power bus $V_{SS}$, or the ground bus GND of the IC chip.

Further to the benefit of an increased ESD protective capability, the pinassignment method of the invention can allow for easy bonding of wires onto those bonding pads that are connected to power pins. This benefit is described in the following with reference to FIG. 5.

Figure 5:
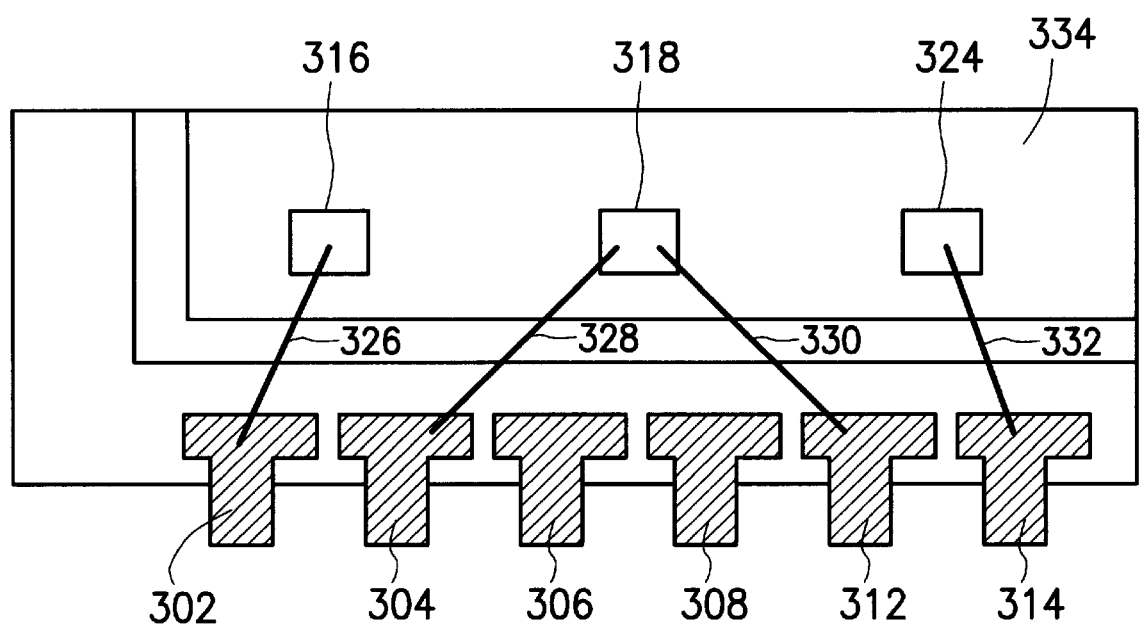
FIG. 5 is a schematic diagram used to depict a second preferred embodiment of the pin-assignment method according to the invention for pin assignment on an IC package.

Referring to FIG. 5, the IC package shown here includes an IC chip 334 having a plurality of bonding pads 316, 318, 324 formed thereon. Further, the IC package includes a plurality of pins 302, 304, 306, 308, 312, 314 which are respectively assigned as an input pin, a first power pin, a first no-connect pin, a second no-connect pin, a second power pin, and an I/O pin. The input pin 302 internally connected via a bonding wire 326 to the bonding pad 316; and the I/O pin 314 is internally connected via a bonding wire 332 to the bonding pad 324. The pin-assignment method here differs from that shown in FIG. 3 only in that the two power pins (i.e., 304, 312) that bound the consecutive group of no-connect pins 306, 308 is wired to a common bonding pad (i.e., respectively via the bonding wire 328 and the bonding wire 330 to the same bonding pad 318. This arrangement also can prevent the ESD stress applied to the two no-connect pins 306, 308 from causing ESD damage to other pins. Therefore, the bonding pads on the IC chip can be arranged in such a manner that at least one bonding pad used for power connection is disposed near each no-connect pin group. This allows the same bonding pad to be wired to the two power pins that bound the no-connect pin group, thus saving the number of bonding wires that can reduce the manufacturing cost.

The invention is characterized in that the pins of an IC package are arranged in such a manner that the no-connect pins are set apart into a plurality of groups or at least one group, with each group containing one single no-connect pin or a number of consecutive no-connect pins, and then each of the two pins that bound both sides of each no-connect pin group is assigned as a power pin. The invention not only can provide an increased ESD protective capability, but also allow for a reduced wiring complexity and thus the manufacturing cost. The pin-assignment method of the invention is useful on IC packages with plastics or resin compounds, such as QFP, MQFP, and TQFP. Besides, the pin-assignment method of the invention is particularly useful to provide an increased ESD protective capability when used on IC packages having more than 100 pins, of which at least five are no-connect pins, such as 100-pin, 128-pin, and 160-pin IC packages having at least five no-connect pins, or on IC packages with more than 200 pins, of which at least 10 are no-connect pins, such as 208-pin IC packages having at least 10 no-connect pins.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A pin-assignment method for use on an IC package having a plurality of pins including a number of no-connect pins, said IC package encasing an IC chip having a plurality of bounding pads thereon, said pin-assignment method comprising:

arranging said no-connect pins into at least one group; and arranging the two pins that bound both sides of each no-connect pin group to be connected to power pins.

2. The pin-assignment method of claim 1, wherein said no-connect pin group includes one single no-connect pin.

3. The pin-assignment method of claim 1, wherein said no-connect pin group includes a number of consecutive no-connect pins.

4. The pin-assignment method of claim 3, wherein said IC package has four sides and four corners, and said group of consecutive no-connect pins are all arranged on one side of said IC package.

5. The pin-assignment method of claim 3, wherein said IC package has four sides and four corners, and at least two no-connect pins in said group of consecutive no-connect pins are arranged on different sides of said IC package at one corner.

6. The pin-assignment method of claim 1, wherein said IC package includes a plastic compound for encasing the IC chip.

7. The pin-assignment method of claim 1, wherein said IC package includes a resin compound for encasing the IC chip.

8. The pin-assignment method of claim 1, wherein said IC package is a quad flat package.

9. The pin-assignment method of claim 1, wherein said power pin is a $V_{DD}$ pin.

10. The pin-assignment method of claim 1, wherein said power pin is a ground pin GND.

11. The pin-assignment method of claim 1, wherein the two pins bounding each no-connect pin group are wired respectively to a neighboring pair of the bonding pads on the IC chip.

12. The pin-assignment method of claim 1, wherein the two pins bounding each no-connect pin group are wired to a common bonding pad on the IC chip.

13. A pin-assignment method for use on an IC package having more than 100 pins including at least five no-connect pins, said IC package encasing an IC chip having a plurality of bounding pads thereon, said pin-assignment method comprising:

arranging said no-connect pins into at least one group; and arranging the two pins that bound each no-connect pin group to be connected to power pins.

14. The pin-assignment method of claim 13, wherein the sum of said no-connect pin groups consists of no-connect pins only and includes at least 5 no-connect pins.

15. The pin-assignment method of claim 13, wherein the sum of said no-connect pin groups consists of all no-connect pins in said IC package.

16. The pin-assignment method of claim 13, wherein said IC package has more than 200 pins including at least 10 no-connect pins.

17. The pin-assignment method of claim 16, wherein the sum of said no-connect pin groups consists of no-connect pins only and includes at least 10 no-connect pins.

18. The pin-assignment method of claim 16, wherein the sum of said no-connect pin groups consists of all no-connect pins in said IC package.

19. The pin-assignment method of claim 16, wherein said IC package has at least 20 no-connect pins; wherein the sum of said no-connect pin groups consists of no-connect pins only and includes at least 20 no-connect pins.

20. The pin-assignment method of claim 16, wherein said IC package has at least 20 no-connect pins; wherein the sum of said no-connect pin groups consists of all no-connect pins in said IC package.

21. The pin-assignment method of claim 13, wherein said no-connect pin group includes one single no-connect pin.

22. The pin-assignment method of claim 13, wherein said no-connect pin group includes a number of consecutive no-connect pins.

23. The pin-assignment method of claim 16, wherein said IC package has four sides and four corners, and said group of consecutive no-connect pins are arranged on one side of said IC package.

24. The pin-assignment method of claim 16, wherein said IC package has four sides and four corners, and at least two no-connect pins in said group of consecutive no-connect pins are arranged on different sides of said IC package at one corner.

25. The pin-assignment method of claim 13, wherein said IC package includes a plastic compound for encasing the IC chip.

26. The pin-assignment method of claim 13, wherein said IC package includes a resin compound for encasing the IC chip.

27. The pin-assignment method of claim 13, wherein said IC package is a quad flat package.

28. The pin-assignment method of claim 13, wherein said power pin is a power $V_{DD}$ pin.

29. The pin-assignment method of claim 13, wherein said power pin is a ground pin GND.

30. The pin-assignment method of claim 13, wherein the two pins bounding each no-connect pin group are wired to a neighboring pair of the bonding pads on the IC chip.

31. The pin-assignment method of claim 13, wherein the two pins bounding each no-connect pin group are wired to a common bonding pad on the IC chip.

32. A pin-assignment method for use on an IC package having a plurality of pins which include a number of active pins and no-connect pins, said IC package encasing an IC chip having a plurality of bounding pads thereon, said pin-assignment method comprising:

arranging said no-connect pins into at least one group, wherein each group including either one no-connect pin or a number of consecutive no-connect pins; and arranging each of the two pins that bound each no-connect pin group to be electrically connected to a power bus.

33. A pin-assignment method for use on an IC package having a plurality of pins which include a number of active pins and no-connect pins, said IC package encasing an IC chip having a plurality of bounding pads thereon, said pin-assignment method comprising:

arranging said no-connect pins into at least one group, wherein each group is formed by either one no-connect pin or a number of consecutive no-connect pins; and arranging at least a pair of pins that bound a no-connect pin group on two-sides to be electrically connected to a power bus of said IC chip.

34. The pin-assignment method of claim 32, wherein each of the two pins that bound each no-connect pin group is further internally wired to said bonding pads respectively on said IC chip.

35. The pin-assignment method of claim 33, wherein the pair of pins that bound a no-connect pin group on two-sides is further internally wired together to one of said bonding pads on said IC chip.

* * * * *